United States Patent [19]
Stein et al.

[11] 4,060,801
[45] Nov. 29, 1977

[54] METHOD AND APPARATUS FOR NON-SCAN MATRIX ADDRESSING OF BAR DISPLAYS

[75] Inventors: Charles R. Stein, Schenectady, N.Y.; William L. Carl, Montgomeryville, Pa.

[73] Assignee: General Electric Company, Schenectady, N.Y.

[21] Appl. No.: 714,255

[22] Filed: Aug. 13, 1976

[51] Int. Cl.$^2$ .............................................. G06F 3/14
[52] U.S. Cl. ......................... 340/324 R; 340/166 EL; 350/160 LC
[58] Field of Search ....... 340/166 EL, 324 R, 324 M, 340/336; 350/160 LC

[56] References Cited

U.S. PATENT DOCUMENTS

| | | | |
|---|---|---|---|
| 3,328,790 | 6/1967 | Rhodes | 340/166 EL |
| 3,740,717 | 6/1973 | Huener et al. | 340/166 EL |
| 3,898,642 | 8/1975 | Dorey et al. | 340/324 R |
| 3,934,241 | 1/1976 | Weigert | 340/324 R |

*Primary Examiner*—Marshall M. Curtis
*Attorney, Agent, or Firm*—Geoffrey H. Krauss; Joseph T. Cohen; Jerome C. Squillaro

[57] ABSTRACT

A method for the non-scanned matrix addressing of bar displays, particularly of the liquid crystal type, for driving all "on" elements of the display to full optical saturation and, hence, achieving uniform brightness and contrast, comprising the steps of driving the common electrodes of subordinate, "full-on" blocks of data segments with a first waveform of amplitude and frequency differing from the data signal waveform; driving the common electrode of a transitional, "top-of-the-bar" block of data segments with a second waveform of amplitude and frequency similar to a data signal waveform; and driving the common electrodes of the uppermost, "off" blocks of data segments with a waveform of frequency higher than the display cut-off frequency. Apparatus is disclosed for generating and switching the required waveforms to facilitate use of such a bar display.

30 Claims, 7 Drawing Figures

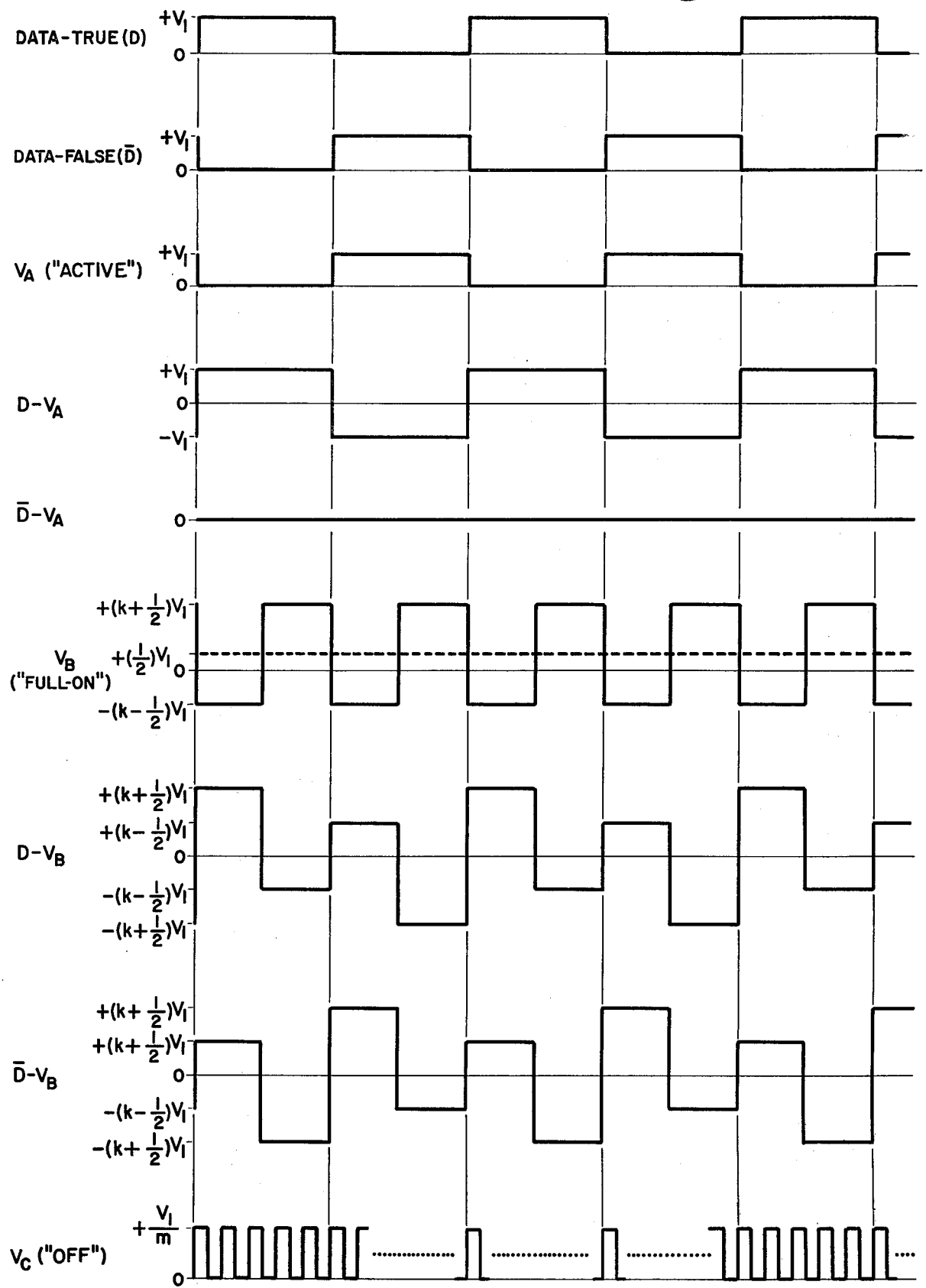

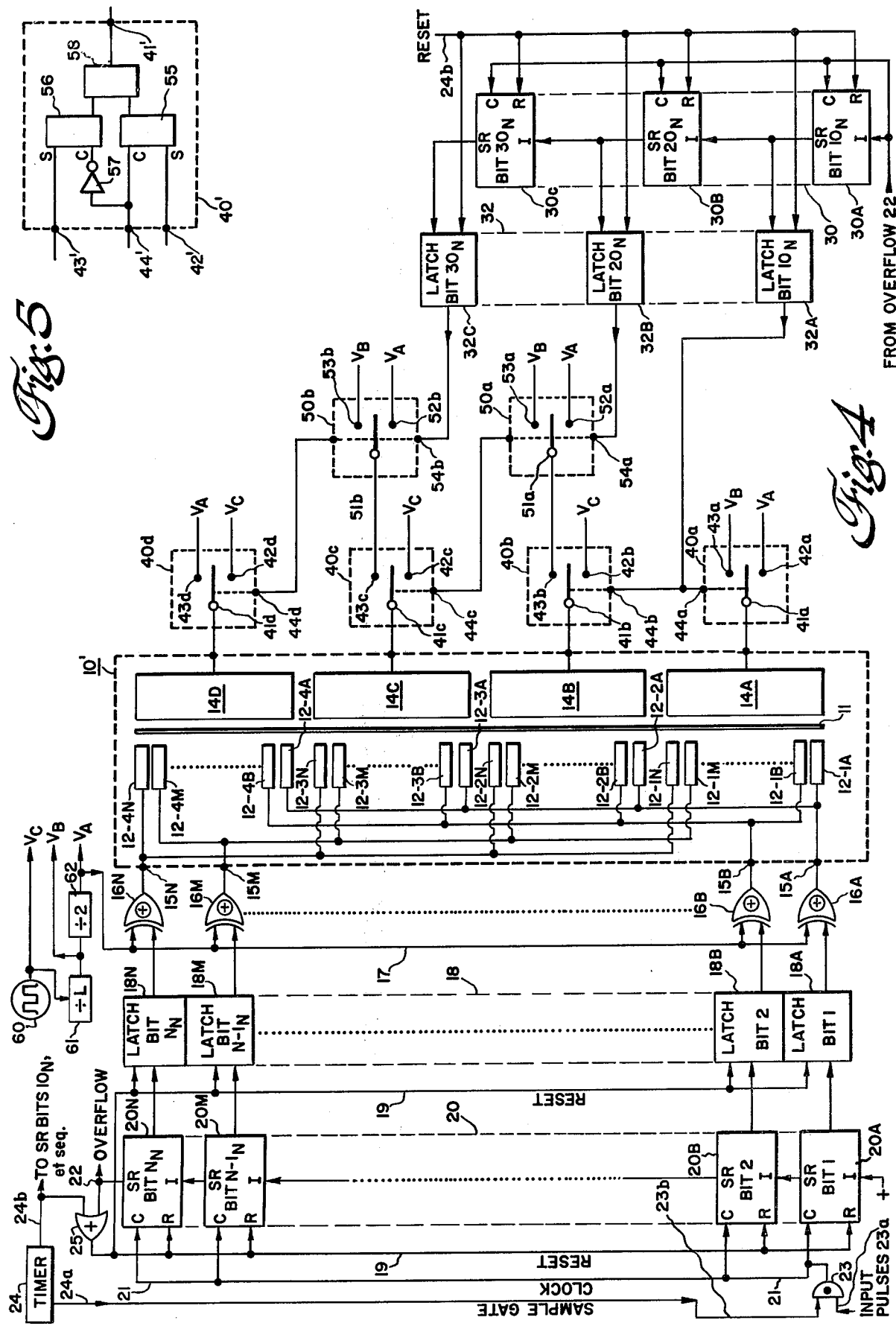

METHOD AND APPARATUS FOR NON-SCAN MATRIX ADDRESSING OF BAR DISPLAYS

BACKGROUND OF THE INVENTION

The present invention relates to electronic displays and, more particularly, to a method and apparatus for non-scan matrix addressing of a bar display of the liquid crystal type.

There is presently substantial interest in electronic displays of the bar-graph type, i.e., a display in which the length of a column of light is proportional to the magnitude of a parameter being measured. Bar graph displays are known utilizing gas discharge, light emitting diode, liquid crystal and other technologies. Bar displays utilizing liquid crystal technology are particularly advantageous in that a display having a plurality of individual segments, typically greater than 40, can be realized with minimal power consumption for the display element itself. However, both the contrast ratio and the response time of a liquid crystal display utilizing so-called "coincident", or 2D, matrix addressing circuitry is usually a function of the scanning duty cycle. Liquid crystal devices, being RMS responsive, are severely limited by the time sharing requirements of a scanned address matrix, whereby contrast becomes unusably poor and/or response times become unusually long, for duty cycles in excess of about 1 in 32.

Desirably, the response time characteristics of a non-multiplex system should be retained while facilitating an addressing scheme by which all of the elements of the matrix, regardless of the number thereof, can be driven to full optical saturation.

BRIEF SUMMARY OF THE DISCLOSURE

In accordance with the invention, a method for the nonscan matrix addressing of bar displays, particularly of a liquid crystal type, having a plurality of groups each consisting of a plurality of data segment electrodes, each group associated with one of a plurality of common electrodes, and capable of driving all "visible" elements of the display to full optical saturation and, hence, achieving uniform brightness and contrast, comprises the steps of driving the common electrodes of subordinate, "full-on" blocks of data segment electrodes with a first waveform having a frequency greater than or less than the data signal electrode waveform by a factor of 2 and an amplitude greater than the data segment electrode waveform amplitude by a fixed factor, including a selected d.c. offset; driving the common electrode of a transitional, "top-of-the-bar" block of data signal electrodes with a second waveform of equal amplitude and square wave frequency to the amplitude and frequency of the waveform driving the data segment electrodes; and driving the common electrodes of the uppermost, "off" block of data signal electrodes with a waveform of frequency higher than the response cut-off frequency of the liquid crystal material and of an amplitude having a fixed relationship to the cut-off frequency. The proper one of the first, second and third waveforms is switched to each of the plurality of common electrodes in accordance with a count of input pulses representing the length of the bar to be displayed.

Apparatus for generating and switching the required waveforms to facilitate use of such a bar display includes a square wave oscillator at the cut-off frequency and counter means for reducing the frequency to generate both the data segment electrode square wave and the transitional electrode square wave (having a frequency differing by a factor of 2 from the data segment electrode waveform). In a preferred embodiment, operational amplifier means scale the amplitudes of the three waveforms and allow introduction of the offset required for the "full-on" common electrode waveform. Timing, gating and counter means suitable for a bar display realizing any selected number-system base, and latching means for the storage of the output of the shift register stages drive means, associated with each common electrode for switching between the three waveforms, while providing proper driving waveforms to corresponding ones of the data segment electrodes of each group thereof, is disclosed.

Accordingly, it is a primary objective of the present invention to provide a novel method for the nonscanned matrix addressing of a bar display, and particularly a bar display of the liquid crystal type.

It is another object of the present invention to provide a novel method for driving all "visible" elements of a bar graph display to full optical saturation to achieve uniform brightness and contrast therein.

It is still another object of the present invention to provide novel apparatus facilitating the generation and switching of waveforms required to implement the use of the novel method with a bar display.

These and other objects of the present invention will become more apparent upon consideration of the following detailed description taken in conjunction with the drawings.

BRIEF DESCRIPTION OF THE DRAWINGS

FIG. 2 is a set of coordinated logic waveforms illustrated the operation of the non-scanned matrix addressing method of the present invention;

FIG. 4 is a schematic diagram of one preferred embodiment of electronic circuitry for the non-scanned matrix addressing of a bar display in accordance with the principles of the present invention;

FIG. 5 is a schematic diagram of an electronic switch suitable for use in the preferred embodiment circuitry of FIG. 3;

DETAILED DESCRIPTION OF THE INVENTION

Figure 1:
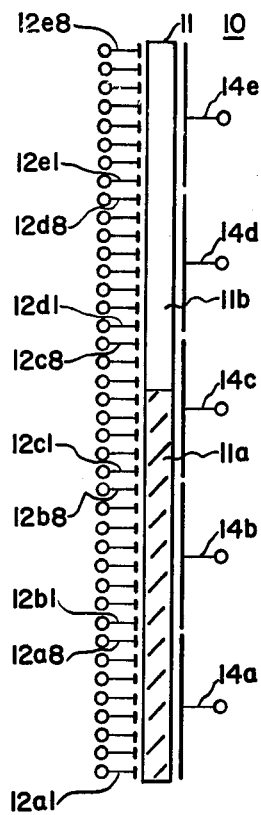
FIG. 1 is a schematic representation of a bar display of the liquid crystal type.

Referring initially to FIG. 1, a bar-graph display 10 includes a column 11 in which liquid crystal material is enclosed. A plurality of conductive data segment electrodes 12 are linearly arranged along a predetermined mathematical curve, herein shown to be a straight vertical line, and are arranged in sequential groups of N data segment electrodes each, where N is a number system modulus (or base) selected for use therein. Each of a second plurality of common electrodes 14 are arranged upon the opposite side of column 11, with each common electrode 14 being parallel to and co-extensive with the N data segment electrodes of a group. Thus, a bar-graph display consisting of 40 data segment electrodes 12 may be divided, utilizing a number system base N=8, into five groups consisting of 8 data segments each (e.g. 12a1-12a8, 12b1-12b8, 12c1-12c8, 12d1-12d8, and 12e-1-12e8) with each group data segment being aligned over one of five common electrodes 14a—14e. As is well known, the liquid crystal material in column 11 may initially be in a first light-transmissive condition, e.g., an absorptive state, whereby ambient light is absorbed by all of column 11 to render the column "dark", indicative of zero units of bar length. An RMS voltage, in excess of the threshold voltage $V_{TH}$ of the liquid crystal material, is subsequently impressed between each data segment electrode, e.g. between data segment electrodes 12a1-12c5, inclusively, and the associated common electrodes, e.g. 14a-14c, to induce an electric field through the liquid crystal material of column 11, of magnitude sufficient to activate the material to the remaining light-transmissive condition, e.g. a transmissive state, to cause ambient light to be reflected along the length 11a of the affected data segments to be viewable by an observer, with the remaining length 11b of the column being in the "dark" state; preferably, the RMS voltage is of a magnitude which causes optical saturation of the material. Data segments 12 are sequentially energized from lowermost segment 12a1 to uppermost segment 12e8 to cause the height of the light bar to increase and indicate successively greater magnitudes of a parameter being measured. Thus, as illustrated in FIG. 1, the first twenty-one data signal electordes (12a-1-12c5) are activated whereby the bottom 21, of 40 total, segments of the column are viewable by an observer, with the upper 19 segments of the column being "dark". It should, of course, be understood that the liquid crystal material may initially be in the opposite state, whereby the column is initially viewable along its entire length, with the bottom portion 11a becoming "dark" as the display is activated to indicate the magnitude of the incoming information.

The groups of data segments may be classified into one of three types, dependent upon the light-transmissive condition of the data segments therein. A first type of common electrode and data segment electrode group has all of the over-lying liquid crystal material in the activated and visible condition below the top edge of the common electrode (e.g. common electrode 14a in the illustrated 21-of-40-maximum count example) and is defined as being in the "full-on" condition. A second type of group of common and data segment electrodes (e.g., common electrode 14d and data segment electrodes 12d1-12d8) has its associated column length of liquid crystal material in the completely unactivated condition, and hence causes that portion of column 11 to be "dark", and is defined as being in the "off" condition. A third type of data segment block is the intermediate, or "top-of-the-bar", block (e.g., data segment electrodes 12c1-12c8, associated with common electrode 14c) which block has only a lower portion of the length of its associated column of liquid crystal material and its data segment electrodes activated.

As is known, square waves (having zero DC voltage) can be applied to common electrodes 14 and, by means of a multi-stage shift register, to the first K stages (K=21 in the illustrated example of FIG. 1) of a shift register which couples a voltage to associated data segment electrodes (e.g., 12a1 - 12c5) to drive the RMS responsive column 11 of liquid crystal material in matrix scan fashion. As is aslo well known, similarly placed data segments of each group of data segments, such as segments 12a1, 12b1, 12c1, 12d1 and 12e1 (being the lowermost segment of each group), may be coupled in electrical parallel connection to one another (FIG. 4) to reduce the number of data segment electrode connections external to display device 10 by a factor equal to the number of groups of data segments 12 (e.g., in a 40 segment device, arranged in groups of 8, a reduction from 40 individual segment electrode leads to 8 parallel leads, each connected to five data segment electrodes 12ax, 12bx, 12cx, 12dx and 12ex, where $1 \leq x \times \leq 8$).

Referring now to FIG. 2, we have found that display device 10 is addressable in non-scanned matrix fashion by driving the common electrodes of each of the three different operational electrode classes with a waveform of differing amplitude and frequency characteristics, especially when the data segment electrodes are driven in parallel, multiplex fashion. Thus, in the example illustrated in FIG. 1 the first through fifth (i.e. the first S electrodes, where S equals the number T of input pulses minus the highest whole multiple of base N less than T) multiplexed data segment electrodes of each block are driven by a data-true (D) square wave at a first frequency $F_0$, with the waveform alternating between zero voltage and a first non-zero voltage ($+V_1$). The remaining data segment electrodes 12 of a transitional block, and therefore of all blocks (as like data segment electrodes of each block are connected in electrical parallel fashion), are driven by a data-false ($\overline{D}$) waveform, i.e., a square wave at frequency $F_O$ alternating between $+V_1$ and 0 volts as the inverse of the data-true waveform.

The common electrode (e.g., 14c) associated with the transitional, "top-of-the-bar" block is driven by an "active" signal $V_A$ which is a square wave of frequency $F_0$, in phase with the D waveform, and alternating between $+V_1$ and 0 volts. The electric field vector (D-$V_A$) between a data segment electrode 12 and its associated common electrode 14, across a segment of liquid crystal material in column 11, is of zero amplitude when the data segment and common electrodes are respectively driven by the D and active waveforms; the field (D-$V_A$) through the column responsive to driving by the D and active waveforms is a square wave of frequency $F_0$ alternating between a voltage of $+V_1$ (waveform D at $+V_1$ and the "active" waveform at 0) and $-V_1$ (D at 0 volts and "active" waveform at $V_1$ volts), with a total DC voltage of 0, a peak-to-peak voltage of $2V_1$ and an RMS voltage of $V_1$. Thus, in the "active" portion of the bar display, the liquid crystal material in column 11 is always subjected to a field having both a zero DC voltage (to prevent dissociation and long term instability effects from occurring in the liquid crystal material) and a non-zero RMS voltage, associated with each data segment electrode required to cause a portion of column 11 associated therewith to be visible.

The blocks of data segment electrodes below the "top-of-the-bar" block (e.g. data segment electrodes 12a1-12b8, in the illustrated example) must cause all of the portion of column 11 associated therewith to be visible to an observer regardless of the data segment waveform (D or $\overline{D}$) thereon. We have found that this condition is obtained by driving the common electrodes 14 (e.g. common electrodes 14a and 14b, for the illustrated example of FIG. 1) with a "full-on" waveform which is a square wave at an even multiple, or submultiple, of the frequency $F_0$ utilized for the "active" D and D waveforms. Any even multiple or submultiple of frequency $F_0$ is usable, as long as the chosen frequency is below the cut-off frequency of the liquid crystal material utilized in column 11. It is preferred that the "full-on" waveform be of a frequency either twice or one-half that of the "active" frequency, for circuitry simplification reasons which will become more apparent hereinbelow. Utilizing a "full-on" square wave of double the frequency, i.e., $2F_0$, having a peak-to-peak amplitude equal to $2KV_1$, where $k$ is a number greater than 1, the "full-on" waveform is biased for equal amplitude excursions about a DC voltage equal to one-half the peak-to-peak voltage of the "active" waveform, e.g., a DC offset of $+\frac{1}{2} V_1$. Thus, the "full-on" voltage $V_B$ alternates between voltage levels of $-(k-\frac{1}{2})V_1$ and $+(k+\frac{1}{2})V_1$. The field $(D-V_B)$ in the liquid crystal material of column 11, attributable to a data segment electrode having a data-true voltage D and a common electrode having $V_B$ therebetween is attributable to the vector sum of the voltages, with four different sequential states: a first level of $+(k+\frac{1}{2})V_1$, when $D = +V_1$ and $V_B = -(k-\frac{1}{2})V_1$; a second sequential level of amplitude equal to $-(k-\frac{1}{2})V_1$, with $D = +V_1$ and $V_B = +(k+\frac{1}{2})V_1$; a third sequential level of amplitude equal to $+(k-\frac{1}{2})V_1$, with $D = 0$ and $V_B = -(k-\frac{1}{2})V_1$; and a fourth sequential level (prior to repeating levels 1-4, indefinitely) of amplitude $-(k+\frac{1}{2})V_1$, with $D = 0$ and $V_B = +(k+\frac{1}{2})V_1$. Similarly, the field $(D-V_B)$ attributable to driving a data segment electrode with the data-false waveform D and the common electrode with the "full-on" waveform is composed of the same four levels, in similar sequence, but shifted whereby the third level occurs simultaneously with the first level of the data-true, $V_B$ waveforms.

As may be seen from the $D-V_B$ and the $D-V_B$ waveforms of FIG. 2, the net DC voltage across the liquid crystal material has the desired zero DC amplitude, with the pair of waveforms each having a peak-to-peak voltage of $(2k + 1) V_1$ and an RMS voltage $= \frac{1}{2} V_1\sqrt{4k^2+1}$). This relationship holds whether the "full-on" voltage has a frequency of twice, or one-half, the data frequency $F_0$.

By establishing the RMS voltage across the liquid crystal material in both the "active" and "full-on" states to be equal, equal brightness and contrast is facilitated in the column, whereby optical properties do not change with viewing angle. Thus, setting $V_1(\frac{1}{2} \sqrt{4k^2+1}) = V_1$, the desired condition (equal RMS voltages) is obtained with $k$ essentially equal to $\sqrt{3/2}$, i.e. the "full-on" waveform having a peak-to-peak voltage equal to $\sqrt{3}$ times the peak-to-peak voltage of the "active" waveform. It should be understood that this value of $k$ is a desirable goal, but that proper operation of the present invention is possible with some deviation from a value of $k$ exactly equal to $\sqrt{3/2}$, as slight differences in RMS voltage will still cause the desired optical saturation of the liquid crystal material, if the basic design voltage $V_1$ is initially established to be greater than $\sqrt{2}(V_{TH})$.

In the third, "off", condition, the presence of a data-true D or a data-false D waveform at any data signal electrode associated with a "cut-off" common electrode must have the same effect on the liquid crystal material, i.e., the column must remain "dark" to an observer. We have found that driving each "off" common electrode with a square wave of frequency greater than the cut-off frequency of the liquid crystal material utilizing in column 11 assures that a change in light-transmissive state will not occur, even if the drive to an associated data segment electrode is varied between the data-true D and data-false D waveforms.

Figure 3:
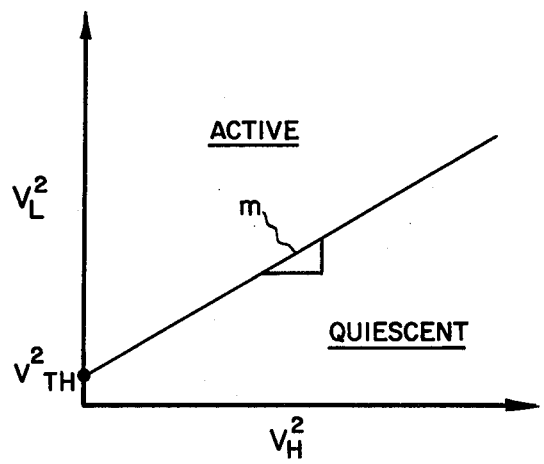
FIG. 3 is a graph illustrating an activation relationship between the square of the high frequency voltage and the square of the low frequency voltage between a data segment electrode and a common electrode of a liquid crystal bar display.

Referring specifically to FIG. 3, wherein increasing values of the square of the amplitude of a high frequency waveform is plotted along the abscissa and increasing values of the square of a low frequency waveform is plotted along the ordinate, the visual respones threshold curve of a typical column 11 of liquid crystal material has a low frequency - high frequency relationship proportional to the squares of the voltages and having a slope $m$. Thus, $V_L^2 = mV_h^2 + V_{TH}^2$, where $V_{TH}$ is the DC threshold voltage. The slope is a function of the liquid crystal material and typically varies between 0.1 and 0.7. For some frequency $F_{OFF}$ greater than the cutoff frequency of the material, and typically established to be on the order of 20 times greater than the data frequency $F_0$, a square wave of amplitude $V_1/m$ renders ineffective all low-frequency fields and causes the liquid crystal material to remain in the quiescent region below the visual response threshold curve, even though the RMS voltage therein in not zero, such that the portions of column 11 associated with the "off" common electrodes will always appear "dark" when viewed by an observer.

In summation of the method of the present invention, matrixaddressed data segment electrodes are driven over a portion of each data segment block with a data-true waveform and are driven over the remainder of each data segment block with a data-false waveform which is the inversion of the data-true waveform. A common electrode associated with each data block having data segments to be completely visible is driven by a "full-on" waveform which is preferably at either twice, or one-half, the frequency of the data segment electrode waveform, and is of a peak-to-peak amplitude approximately $\sqrt{3/2}$ times as great as the amplitude of the data segment electrode waveform, with a positive DC offset equal to one-half the peak amplitude of the data waveform. A common electrode for a transitional block is driven by the data-false D waveform, while an "off" block common electrode is driven by a square wave having a high frequency greater than the cut-off frequency of the liquid crystal material in the display and having an amplitude essentially equal to 1/m times the amplitude of the data waveform, wherein $m$ is a number less than 1 and associated with the high frequency response of the particular liquid crystal material utilized.

Referring now to FIG. 4, a 40 segment bar display 10' is partitioned into four blocks of 10 data segments each (the decimal system modulus N = 10 being used), with four groups of data segment electrodes: 12-1A to 12-1N, 12-2A to 12-2N, 12-3A to 12-3N, and 12-4A to 12-4N. Each group is aligned over one of four common electrodes 14A-14D. As previously mentioned hereinabove, similarly placed data segments of each group, e.g., 12-1A, 12-2A, 12-3A and 12-4A (being the lowermost data segments of each group), are coupled in electrical parallel connection to one another to reduce the number of data segment electrode connections external to display device 10' by a factor equal to the number of groups of data segments 12, e.g., from 40 individual leas to 10 parallel leads 15A-15N, each connected to four data segment electrodes 12-1X, 12-2X, 12-3X and 12-4X, where $1 \leq X \leq N$.

Each of parallel input leads 15A-15N is coupled to the output of an associated two-input EXCLUSIVE- OR (XOR) gate 16A–16N, respectively. One input of each XOR gate 16 is coupled to a line 17 driven by a squarewave signal at first frequency $F_O$. The remaining input of each XOR gate is coupled to the output of an associate one of a plurality N of data latches 18A–18N. Each data latch 18 has a reset input coupled to a master reset line 19; upon receipt of a reset logic state, herein being a logic one (positive logic) level, the output of each latch is forced to a selected logic level (herein a logic zero state), irrespective of all other conditions. Each data latch 18 also has a data input to control the logic state of the latch output, responsive to the removal of the reset logic input state. The data input of each latch 18 is coupled to the logic output of one of a plurality of stages 20A–20N of a N-stage shift register 20. Each stage of shift register 20 has three inputs: a reset input R coupled to master reset line 19, a clock input C coupled to a clock line 21 in electrical parallel connection with the clock inputs of each of the remaining shift register stages; and a data input I. Additionally, the N-th stage 20N of the shift register has an overflow output 22, enabled under conditions to be described hereinbelow. The data input of the first bit stage 20A of the shift register is coupled to a positive potential (a logic one level) while the data input of each of the remaining bit stages 20B–20N is coupled to the output of the immediately preceding bit stage.

Clock line 21 is enabled by the output of a two-input AND gate 23 receiving a train of input pulses at a first input 23a and a logic-one sample gate at its input 23b from a first output 24a of a timer means 24. A remaining output 24b of timer means 24 generates a reset signal with a logic one level at a time differing from the logic one level of the sample gate at output 24a.

A two-input OR gate 25 receives timer reset output 24b and the overflow output 22 of the shift register last bit stage 20N at its inputs and has its output coupled to the shift register-latch common reset line 19, for use as hereinbelow more fully explained.

A second plurality of shift register bit stages 30A–30C each have a reset input R (coupled to reset output 24b), a clock input C (coupled to overflow output 22 of the last bit stage 20N of shift register 20), and a data input I. The data input of the first stage 30A is coupled to overflow output 22, while the data input of each remaining stage of shift register 30 is coupled to the output of the immediately preceding stage. Shift register 30 contains P stages, where P is one less than the number of datablocks, i.e., the ratio of the number of data signal electrodes 12 to the number of stages N in shift register 20.

A like plurality P of data latches 32 each have a reset input coupled in parallel to reset output 24b, and a data input coupled to the output of the corresponding stage of shift register 30.

Each common electrode 14A–14D is coupled to the output 41 of an associated single-pole, double-throw switch means 40a–40d, respectively. The output 41 of each switch means 40a–40d is operated respectively between a first input 42 and a second input 43 responsive to the logic level at an associated activation input 44a–44d, respectively. A switch means associated with the lowermost and uppermost common electrodes, e.g., lowermost switch means 40a associated with lowermost common electrode 14A and uppermost switch means 40d associated with uppermost common electrode 14D, have their first and second inputs 42a, 43a and 42d, 43d, respectively, coupled to sources of selected ones of the three common electrode driving waveforms. Those of switch means 40 coupled to intermediate common electrodes, such as intermediate switch means 40b and 40c, respectively coupled to intermediate common electrodes 14B and 14C, respectively, have their first inputs 42b and 42c, respectively, coupled to a source of "off" waveform, while their respective second inputs 43b and 43c are coupled to the respective outputs 51a and 51b of additional single-pole, double-throw switch means 50a and 50b, respectively. The output 51 of each of switch means 50a and 50b is operated respectively between a first input 52 and a second input 53, responsive to the logic level at an associated activation input 54a and 54b, respectively. It should be understood that while switch means 40 and 50, respectively, are shown as mechanical means in FIG. 4, these functions can be advantageously implemented as a fullyelectronic switching means 40' (FIG. 5) comprised of a pair of selectively controlled pass elements 55 and 56, each having a signal input S coupled to one of switch first and second inputs 42' and 43', respectively. A control input C of pass element 55 is coupled to activation input 44' while the control input of the remaining pass element 56 is coupled to activation input 44' via a logic inverter 57; the outputs of both pass elements 55 and 56 are each coupled to one input of a twoinput combining element 58, having its output coupled to switching means output 41'. Thus, the presence of a logic 1 at activation input 44' facilitates the completion of a signal path from first input 42' through pass element 55 and combining element 58, to output 41'; the presence of a logic 0 level at activation input 44' is inverted to provide a logic 1 level at the corresponding input of pass element 56 to enable a signal path from second input 43', through pass element 56 and combining element 58, to switch means output 41', allowing replacement of bulky and power-consuming electromechanical switch means with a low-power-consumption, fully electronic switch means 40'.

As previously mentioned hereinabove, in discussing the novel method for non-scan matrix addressing of a bar display, the lowermost common electrode is energized by either the "active" waveform $V_A$ (for a bar having a length less than N units) and is energized with the "full-on" waveform in all other cases. Thus, lowermost switch means 40a has the "active" waveform $V_A$ coupled to first switch input 42a and has the "full-on" waveform $V_B$ coupled to its second input 43a. The lowermost switch means is activated by the output of latch 32A to couple the "full-on" waveform to output 41a only when the shift register count has indicated receipt of a number of pulses greater than the number base N, as signified by the sitting of latchbit $10_N$ (latch 32A).

Similarly, the uppermost common electrode 14D is energized by the "off" waveform, for all column lengths less than N(Y-1) units, where Y is the number of common electrodes; the uppermost electrode receives the "active" waveform only when more than N(Y-1) units of column length are to be displayed. Thus, uppermost switch means 40d has its first (normally-closed) input 42d coupled to the "off" waveform $V_C$ and its second input 43d coupled to the "active" waveform $V_A$. The uppermost switch means is activated only when the uppermost shift register-latch stage (shift register bit $30_N$ and latch bit $30_N$) are activated to indicate a count greater than or equal to N(Y-1) units.

The intermediate arrangement of switch means 40b, 50a and 40c, 50b must energize intermediate common electrodes 14B and 14C, respectively, with one of the three waveforms; the "off" waveform $V_C$ when a number of input pulses has not reached a count sufficient to cause an output from the immediately preceding stage of shift register 30; the "active" waveform $V_A$ when the shift register stage associated with a switch means 40 has been energized but the next succeeding shift register stage remains unenergized; and the "full-on" waveform $V_B$ when the associated shift register stage and the next succeeding shift register stage are both energized. Thus, the primary switch means 40b or 40c, respectively, receive their activation input signals from the latch bit stages 32a or 32b, respectively associated with "previous" decade shift register stage 30A or 30B, respectively, and additional switch means 50a or 50b, respectively, receive their activation input signals from latch bit stages 32B or 32C, respectively, associated with shift register stages 30B or 30C.

Square wave generating means 60 provides the high frequency square wave of peak-to-peak amplitude $+V_1/m$ for the "off" signal $V_C$. A symmetrical frequency divider 61 divides the high frequency square wave output of generating means 60 by a factor L and scales the amplitude of its output as required to generate the "full-on" waveform $V_b$; an additional divide-by-two means 62 further divides and amplitude scales (as explained more fully hereinbelow) the "full-on" waveform to derive the "active" waveform $V_A$ for driving one input of each of XOR gate 16 and the first inputs 42 of switch means 40a, 50a, 50b and 40d.

In operation, a train of input pulses, at AND gate input 23a, has a frequency related to the amplitude of the parameter being measured. Timer means 24 generates a reset pulse at output 24b serving to reset shift register 30, latch array 32 and (via OR gate 25) shift register 20 and latch array 18. The reset latch bit stages 32 actuate primary switching means 40a, 40b, 40c and 40d, respectively, to couple the "active" waveform to common electrode 14A and the "off" waveform to common electrodes 14B–14D. Simultaneously, the output of each latch bit stage 18 is set to a logic zero state, whereby the square waveform on line 17 is inverted by each of XOR gates 16, such that the field across the portion of column 11 associated with common electrode 14A is the zero-amplitude data-false waveform of FIG. 2, and the field across the remaining length of column 11 is the "off" high frequency waveform. Thus, the entire column is initially "dark".

After cessation of the reset signal at timer output 24b, a sample gate signal is enabled to the logic one level on timer output 24a and at AND gate input 23b, gating a train of input pulses to clock line 21 for the duration of the sample gate time interval. The first input pulse clocks the logic one data input level at the data (I) input into shift register bit one stage 20A, setting the output thereof. The output of the associated latch bit one stage 18A is simultaneously set at the logic one level. Similarly, the second through N-th input pulses clock the logic one level successively to the data input of each successive stage (via coupling from the output of the preceding shift register bit stage) whereby, for M input pulses (M<N), the outputs of all shift register 20A through 20M and latch bit stages 18A through 18M are each respectively set to the logic one level. The logic one levels at the output of bit latch stages 18A–18M cause XOR gates 16A–16M to provide a data waveform (data-true D) of opposite phase from the data waveform (data-false D) enabled by a latch bit output logic zero level. Data segment electrodes 12–1A through 12–1M receive the data-true D waveform which, in conjunction with the presence of the "active" waveform at common electrode 14A, causes M units of the bar column to be observable. The remaining data segment electrodes of the first group receive the data-false D waveform, whereby a zero volts RMS field is applied across the associate portions of the column, which portions remain dark. Similarly, irrespective of the data-true or data-false waveforms at the associated data segment electrodes, the portions of the bar column associated with common electrodes 14B–14D remain "dark" as these common electrodes are driven by the "off" waveform.

Upon reaching a maximum count N, all outputs of shift register 20 are at the logic one level. The N+1-st input pulse causes an overflow, on line 22, from shift register bit N stage 20 N, which overflow signal causes shift register bit 10 stage 30A to be set and, simultaneously, provides a reset pulse, via OR gate 25, on reset line 19 to reset each stage of shift register 20 and latch array 18, during part of the N+1-st input pulse, with shift register bit 1 stage 20A being set to a logic one output during the remainder of the N+1-st pulse, thereby indicating a count of one in register 20 and one in register 30 (e.g. a count of 11, in the illustrated example with N=10). At this time, the data-true D waveform appears only at display input 15A; shift register bit 10 stage 30A and latch bit 10 stage 32A provide logic one outputs actuating primary switch means 40a to couple the "full-on" waveform $V_B$ to common electrode 14A (whereby all units of column 11 associated with data segment electrodes 12-1A through 12-1N are "on") and actuating switch means 40b to couple common electrode 14B to the output of non-actuated switch means 50a, whereby the "active" waveform $V_B$, acting in conjunction with the data-true waveform on data segment electrode 12–2A, causes the lowermost unit of the column associated with common electrode 14B to become visible. The remainder of the data segment electrodes 12–2B through 12–2N, associated with common electrode 14B receive the data-false D waveform and cause a zero-amplitude field in the of column 11 associated with common electrode 14B. The remaining two common electrodes 14C and 14D receive the "off" waveform whereby the associated portions of the liquid crystal column are not visible.

The appearance of additional input pulses at gate input 23a eventually causes shift register 20 to count to a second overflow condition, whereby shift register bit 20 stage 30B and its associated latch bit 20 stage 32B are both set to the logic one output condition, actuating secondary switch means 50a to supply the "full-on" waveform $V_B$ to second common electrode 14B and actuating primary switch means 40C to couple the "active" waveform $V_A$ from the non-actuated auxiliary switch means 50b to common electrode 14C. At this time, the length of column 11 associated with both common electrodes 14A and 14B is fully viewable, regardless of the count in shift register 20; the entire length of the column associated with the common electrode 14D is "dark", as that electrode is still driven by "off" waveform $V_C$; and the length of liquid crystal column 11 associated with common electrode 14C is proportional to the count in shift register 20, as only common electrode 14C is now being driven by the "active" waveform.

Eventually, the number of input pulses reaching shift register 20 cause a third overflow signal on line 22, whereby final shift register bit 30 stage 30C and the associated latch bit 30 stage 32C have their respective outputs set to the logic one level, actuating auxiliary switch means 50b to drive common electrode 14C with the "full on" waveform $V_B$ and actuating primary switch means 40d to substitute the "active" waveform $V_A$ for the "off" waveform $V_C$. The lengths of column 11 associated with common electrodes 14A, 14B and 14C are all visible, while the length of the column associated with common electrode 14D is dependent upon the number of bit stages of shift register 20 having a logic one output and, therefore, causing corresponding ones of data segment electrodes 12–4A through 12–4N to be driven by the data-true D waveform.

At the cessation of the sample gate time interval, AND gate input 23B returns to the logic zero level, whereby further input pulses cannot reach shift register 20. The display maintains the visible bar, of length proportional to the number of input pulses received, until timer means 24 generates a next reset signal at output 24b to reset the shift registers, latch arrays and the display, preparatory to generation of another sample gate to generate a new bar display.

Figure 6:
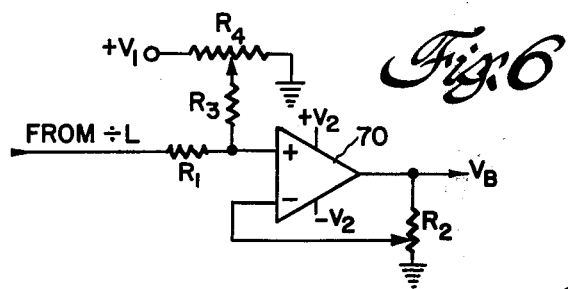
FIG. 6 is a schematic diagram of circuitry for establishing the amplitude and voltage offset characteristics of the driving waveform.

Referring now to FIG. 6, circuitry suitable for establishing the peak-to-peak amplitude and the offset voltage of each one of the three driving waveforms (and particularly the "full-on" waveform $V_B$) comprises an operational amplifier 70 receiving positive and negative supply potentials $+V_2$ and $-V_2$ from power supply means (not shown), which voltages have a magnitude ($V_2$) at least as great as the peak voltage (of either polarity) desired for the particular waveform. The driving waveform, herein illustrated as being the frequency-divided "off" waveform from divide-by-L means 61, is coupled to the non-inverting input of operational amplifier means 70 via a resistance $R_1$. The inverting input of operational amplifier means 70 is coupled to the variable contact of a potentiometer $R_2$ connected between the operational amplifier output and ground, whereby the gain of the non-inverting amplifier stage may be established to amplify the input to the required peak-to-peak amplitude. Another fixed resistance $R_3$ is connected between the non-inverting amplifier input and the variable contact of a second potentiometer $R_4$ having the peak voltage ($+V_1$) of the data and "active" waveforms thereacross. The position of the variable contact arm of the potentiometer $R_4$ is adjusted for the desired DC offset voltage (being approximately $+(\frac{1}{2})V_1$, for the "full-on" waveform $V_B$) and, as previously mentioned, the position of the variable contact arm of potentiometer $R_2$ is adjusted for the desired peak-to-peak amplitude. It should be understood that, due to the relative low current requirements of a liquid crystal bar display, many other circuitry arrangements will allow the establishment of the desired waveform amplitude and offset voltages with equal facility as with the arrangement of FIG. 6.

Figure 7:
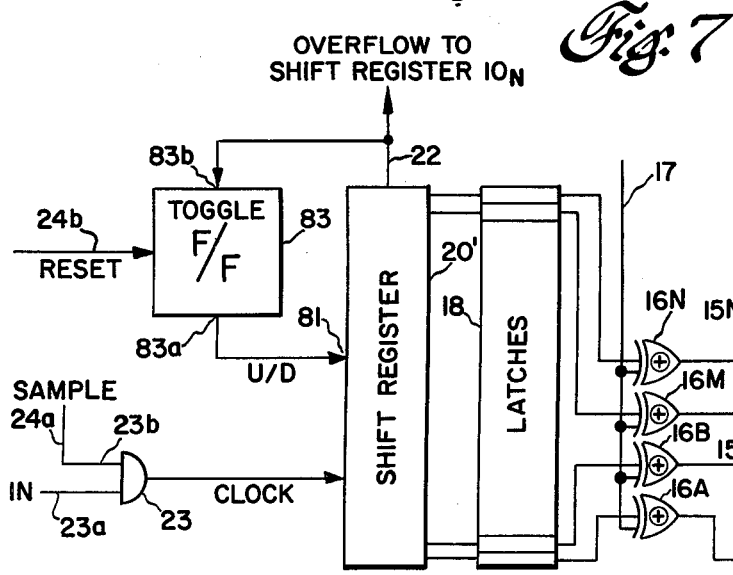
FIG. 7 is a schematic diagram illustrating another preferred variation of bar display and its associated driving circuitry.

Referring now to FIG. 7, wherein like reference designations are utilized for like elements, display 10″ utilizes a liquid crystal display of known technology, wherein all of the multiplexed data segment electrodes 12 appear as a linear array of transparent electrodes, formed of a material such as tin oxide and the like, positioned upon a single planar surface of a transparent substrate. Due to the planar configuration, multiplexing cannot be carried out by means of wiring cross-overs as utilized in the display of FIG. 4, and must be implemented by connecting the M-th data signal electrode of a block to the (N+1-M)-th electrode of the following block, whereby the interconnection leads 80 follow meander-like paths and never cross one another. Thus, first block lowest data segment electrode 12–1A is coupled in parallel to second block highest data segment electrode 12–2N, the third block lowest data segment electrode 12–3A and fourth block highest data segment electrode 12–4N. Shift register 20′ must now be of the selectable-up/down-counting type, as storage of a signal count therein, previously indicative of energizing only the lowermost data signal electrode of each block, will now energize the lowermost data segment electrodes of odd-numbered blocks and the uppermost data segment electrodes of even-numbered blocks whereby, after each odd-numbered overflow signal on line 22, the shift register must be cleared and the outputs of the shift register stages activated from the uppermost stage downwardly to the lowermost stage.

Shift register 20′ has an additional up/down control input 81 coupled to the output 83a of a flip-flop 83 receiving its toggle input 83b from overflow line 22. Flip-flop 83 has a separate reset input coupled to timer reset output 24b.

In operation, the master reset signal on line 24b resets flip-flop output 83a to a logic zero level, whereby the up/down control input 81 of shift register 20′ is set for "up" counting. Upon the appearance of a sample gate on line 24a, the first N input pulses are clocked into shift register 20′ for normal "up" counting and activation of the first block of data segment electrodes 12–1A to 12–1N, with the "active" waveform applied to common electrode 14A. The N-th pulse causes an overflow to appear on line 22, which overflow not only sets shift register bit $10_N$ stage 30A but also appears at the toggle input 83b of flip-flop 83 to set the output 83a thereof to the logic one level, whereby shift register 20′ is commanded to its "down" counting mode. The next clock pulse causes the output of the uppermost register stage to be set to the logic one level, whereby data segment electrode 12–2A is energized (in conjunction with the application of the "active" waveform to common electrode 14B; common electrode 14A now receiving the "full-on" waveform). Additional clock pulses cause the output of additional, sequentially lower stages of shift register 20′ to be energized, until the lowermost stage is energized to cause the display column associated with the entire length of common electrode 14B to be visible. The next input pulse causes another overflow signal on line 22 to toggle flip-flop 83 and set its output 83a to a logic zero condition, causing shift register 20′ to change to the "up"-counting mode, whereby the bit stages are energized in lowermost-to-uppermost sequence for the third block of data segment electrodes, similar to the operation of the first block of data segment electrodes. Thus, shift register 20′ counts "up" for each odd-numbered block of data segment electrodes and counts "down" for each even-numbered block data segment electrodes, under control of the overflow signal on line 22, which controls the application of the "active", "full-on" and "off" waveforms to the common electrodes in the manner previously described hereinabove.

There has just been described a method for the non-scanned matrix addressing of a bar display, and particularly for a bar display of the liquid crystal type. Novel circuitry has also been described for implementing the novel method of the present invention.

While the present invention has been described with reference to several preferred embodiments thereof, many modifications and variations will now occur to those skilled in the art. In particular, while the present description has referred to a bar display of the liquid crystal type, it should be understood that any display wherein sequentially greater or lesser portions of the pattern are to be visible may be equally as well utilized as a linear bar display, and that all display technologies utilizing RMS values of any electrical parameter (i.e., current, resistance, etc. in place of voltage) are equally well adapted to the present method, in addition to the liquid crystal technology herein specifically utilized by way of example. Further, it should be understood that, while the present method has been described with respect to a "full-on" waveform having a frequency twice that of the "active" and data waveforms, the method is equally operable with "full-on" waveforms having frequencies which are any even multiple, or any even sub-multiple, of the "active" waveform; in all cases, the "full-on" waveform will have a constant offset of positive polarity and magnitude equal to one-half the peak value of the "active" and data waveforms and constant value of the constant $k$ (wherein $k$ is always greater than 1) for best (i.e. equal brightness) operation. Similarly, while the "off" signal utilized herein is a high frequency waveform, selected as such due to the particular characteristics of the display material, e.g., a liquid crystal compound having a "blanking" response to a driving frequency greater than its cut-off frequency, the use of displays embodying different materials and technologies will require the use of an appropriate "blanking" signal having electrical characteristics dictated by the cut-off characteristics of the particular device, e.g. an open-circuit signal to commoned terminals of part of an LED array. It is our intent, therefore, to be limited not by the present disclosure, but only by the appended claims.

What is claimed is:

1. A method for the non-scanned matrix addressing of a display having a bar of variable length in a first light-transmissive condition continuously during all of a time interval between each change, responsive to only an external stimulus, of the length thereof, the display comprised of a plurality (Y) of common electrodes, a like plurality (Y) of groups each containing a plurality (N) of data segment electrodes associated with each common electrode, and a plurality (N Y) of consecutive portions of a display element with each portion being associated with one of the plurality of data segment electrodes and the common electrode associated therewith and actuateable between respective first and second light-transmissive conditions responsive to respective first and second magnitudes of a selected electrical parameter established between the associated data segment and common electrodes, comprising the steps of:

a. simultaneously driving selected ones of the data segment electrodes of each group only with a continuous data-true square-waveform of said electrical parameter, said data-true waveform having a first amplitude and a substantially constant first frequency;

b. simultaneously driving the remaining ones of the data segment electrodes of each group only with a continuous data-false square-waveform of said electrical parameter of essentially the same substantially constant frequency and essentially the inversion of the amplitude of the data-true waveform;

c. simultaneously driving the common electrode associated with a transistional "top-of-the-bar" group of data segment electrodes only with a continuous first squarewaveform which is essentially the data-false waveform, to cause the selected parameter to continuously be of the first magnitude between said transitional common electrode and the associated data segment electrodes having the data-true waveform thereon and to continuously be of said second magnitude between said transitional common electrode and the associated data segment electrodes having the data-false waveform thereon;

d. simultaneously driving the common electrode associated with each subordinate "full-on" group of data segment electrodes below the "top-of-the-bar" common electrode only with a second continuous square-waveform of said electrical parameter having an amplitude differing from said first waveform and a frequency equal to one of an even-integer multiple and an even-integer submultiple of the frequency of the first waveform, to cause said electrical parameter to continuously be substantially of said first magnitude between each subordinate common electrode and the entire group of data segment electrodes associated therewith; and e. simultaneously driving each common electrode associated with each "off" group of data segment electrodes above the "top-of-the-bar" common electrode only with a third continuous square-waveform of said selected electrical parameter having a frequency higher than a cut-off frequency of the display element to cause said electrical parameter to continuously be substantially of said second magnitude between each common electrode and the entire group of data segment electrodes associated therewith.

2. A method as set forth in claim 1, wherein step (a) comprises the step of: receiving a sequence of input signals; counting the number of input signals received within a selected time interval; deriving a number M equal to the difference between the number of input signals and the greatest integer multiple of N less than or equal to the number of input signals; and simultaneously driving the first through the M-th data segment electrodes of each group with the continuous data-true square-waveform.

3. A method as set forth in claim 2, wherein step (b) comprises the steps of: simultaneously driving the (M + 1)-st through the N-th data segment electrodes of each group with the continuous data-false square-waveform in accordance with the count of input signals of step (a).

4. A method as set forth in claim 2, wherein step (c) comprises the steps of: generating an overflow signal whenever the number of input signals is an integer multiple of N; counting the number P of overflow signals; and switching the first waveform to the (P + 1)-st common electrode successively further from a lower end of the display in accordance with the count P of overflow signals.

5. A method as set forth in claim 4, wherein step (e) further comprises the step of: initially driving the common electrode closest to the display lower end with the first waveform, prior to the generation of the first overflow signal during each time interval.

6. A method as set forth in claim 4, wherein step (d) comprises the steps of: generating the second waveform independently of the count of input signals; and switching, in accordance with the number P of overflow signals, the second waveform to each of the common electrodes between the display lower end and the P-th common electrode thereabove.

7. A method as set forth in claim 6, wherein step (d) further comprises the step of generating the second waveform with a frequency essentially equal to an even-integer multiple of the first frequency.

8. A method as set forth in claim 7, wherein step (b) further comprises the step of generating the second waveform with an amplitude selected to cause the R.M.S. value of magnitude of said selected electrical parameter responsive to driving any portion of said display element with each of said first and second waveforms to be substantially equal.

9. A method as set forth in claim 8, wherein said first waveform is a square wave having a selected peak-to-peak amplitude (V).

10. A method as set forth in claim 9, further comprising the step of establishing the peak-to-peak amplitude of the second waveform to be about $(\sqrt{3})V$.

11. A method as set forth in claim 6, wherein step (d) further comprises the step of generating the second waveform with a frequency essentially equal to an even integer submultiple of the first frequency.

12. A method as set forth in claim 11, wherein step (d) further comprises the step of generating the second waveform with an amplitude to cause the R.M.S. value of the magnitude of said selected electrical parameter responsive to driving any portion of said display element with each of said first and second waveforms to be substantially equal.

13. A method as set forth in claim 12, wherein the first waveform is a square wave having a selected peak-to-peak amplitude (V).

14. A method as set forth in claim 13, wherein step (d) further comprises the step of establishing the peak-to-peak amplitude of the second waveform to be about $(\sqrt{3})V$.

15. A method as set forth in claim 6, wherein step (d) further comprises the step of initially removing the second waveform from all of the common electrodes.

16. A method as set forth in claim 4, wherein step (e) further comprises the steps of: generating the third waveform independently of the count of input signals; and switching, in accordance with the number P of overflow signals, the third waveform to each of the common electrodes from an upper end of the display to the (P + 2)-nd common electrode above the lower display end.

17. A method as set forth in claim 16, wherein step (e) further comprises the step of initially driving all common electrodes above the lowest common electrode with the third waveform.

18. A method as set forth in claim 1, wherein step (e) further comprises the step of adjusting the amplitude of the third waveform to compensate for high frequency effects on the display elements.

19. Apparatus comprising, in combination:
a bar display comprising a plurality (Y) of common electrodes arranged along a geometric curve having start and end points thereon;
a like plurality (Y) of groups each consisting of a plurality (N) of data segment electrodes with the data segment electrodes of each group sequentially aligned along an associated one of said plurality of common electrodes;
a display element having a plurality of essentially independently actuatable portions, each portion positioned between one of the data segment electrodes and its associated common electrode and actuatable between respective first and second magnitudes of a selected electrical parameter established between the associated data segment and common electrodes; and
non-scanned matrix addressing means comprising first means for receiving a sequence of input signals;
secnd means for counting the number of input signals;
third means for continuously driving, in accordance with the count contained in the first means, at least one of the data segment electrodes in each group only with a data-true (D) square-waveform having a first amplitude and a first substantially constant frequency;
fourth means for continuously driving the remaining ones of the data segment electrodes in each group only with a data-false (D) square-waveform having essentially the same frequency and an amplitude which is the inversion of the amplitude of the data-true waveform;
fifth means for initially driving the common electrode closest to the start point of said display with the data-false waveform and for switching said data-false ewaveform to a common electrode successively further from said start point in accordance with the greatest number of integral multiples of N less than or equal to the number of input signals, to cause the display element portions between the common electrode receiving the D waveform and the data segment electrodes respectively receiving the D and D waveforms to be in the first and second conditions respectively;
sixth means for simultaneously and continuously driving with a second square-waveform of said selected electrical parameter having a frequency greater than a cut-off frequency of the display elements all of the common electrodes between said end point of said display and the common electrode being driven by said fifth means, to cause all of the display element portions adjacent the common electrodes receiving the second waveform to be in the second condition; and
seventh means for simultaneously and continuously driving with a third square-waveform having a frequency and amplitude differing from the frequency and amplitude of said first and second waveforms all of the common electrodes between said start point of said display and said common electrode having said data-false waveform switched thereto, to cause all of the display element portions adjacent to the common electrodes receiving the third waveform to be in the first condition;
whereby only those portions of the display elements from said start point and along a line having a length equal to said number of input signals are in said first light-transmissive condition and visible to an observer.

20. Apparatus as set forth in claim 19, wherein said second means comprises multi-stage counter means for cyclically counting the number of input signals in accordance with a number system modulus N; gating means having first and second inputs and an output coupled to said counter means, said first input of said gating means being coupled to said first means; and timer means coupled to the second input of said gating means for enabling transmission of said input signals from said input means to said counter means during a selected time interval.

21. Apparatus as set forth in claim 20, wherein said second means further comprises latch means coupled to each stage of said counter means for storing the count therein.

22. Apparatus as set forth in claim 19, wherein said second means generates an overflow signal for each count of the number of input signals equaling an integer multiple of the number system modulus N; said fifth means comprising register means for sequentially counting the number P of overflow signals; latch means associated with said register means for storing the count of overflow signals; and a plurality of first switch means coupled to said latch means for each individually and sequentially coupling the the $\overline{D}$ waveform to a different one of said common electrodes in accordance with the number P of overflow signals.

23. Apparatus as set forth in claim 22, wherein said first switch means associated with the common electrode closest to said start point couples said D waveform thereto only if said register means has not received an overflow signal.

24. Apparatus as set forth in claim 22, wherein said plurality of first switch means is equal in number to Y.

25. Apparatus as set forth in claim 22, wherein said sixth means comprises second source means for providing said second waveform at said frequency greater than the cut-off frequency of said display element; and a plurality of second switch means for coupling said second waveform to each one of said common electrodes initially excluding the common electrode nearest said start point and for sequentially decoupling, responsive to each overflow signal, said second waveform from that common electrode furthest from said end point receiving said second waveform immediately prior to each overflow signal.

26. Apparatus as set forth in claim 25, wherein said plurality of second switch means is equal in number to (Y−1).

27. Apparatus as set forth in claim 25, wherein said second waveform is a square wave having a frequency of at least said cut-off frequency; said second source means further including means for scaling the amplitude of said square wave.

28. Apparatus as set forth in claim 27, wherein said fifth means includes means for dividing the frequency of said second source to obtain a square wave at said first frequency; and means for varying the amplitude of said first frequency square wave to said first amplitude.

29. Apparatus as set forth in claim 19, wherein said seventh means comprises third source means for providing said third waveform; and means for coupling said third waveform to all of said common electrodes not having one of said first and second waveforms coupled thereto.

30. Apparatus as set forth in claim 29, wherein said third and fourth means includes first source means for providing a square wave of said selected electrical parameter at said first frequency, said third source means including means for providing said third waveform as a square wave having a frequency equal to an even multiple or submultiple of said first frequency square wave; and means for scaling the peak-to-peak amplitude of said third waveform square wave to be substantially equal to $\sqrt{3}$ times the peak-to-peak amplitude of said first waveform square wave.

* * * * *